(12) United States Patent
Kitamura

(10) Patent No.: US 9,441,179 B2
(45) Date of Patent: Sep. 13, 2016

(54) SILICON WAFER PROCESSING SOLUTION AND SILICON WAFER PROCESSING METHOD

(71) Applicant: IDEMITSU KOSAN CO., LTD., Tokyo (JP)

(72) Inventor: Tomohiko Kitamura, Ichihara (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/523,494

(22) Filed: Oct. 24, 2014

(65) Prior Publication Data

US 2015/0045264 A1 Feb. 12, 2015

Related U.S. Application Data

(62) Division of application No. 13/816,938, filed as application No. PCT/JP2011/068899 on Aug. 23, 2011, now abandoned.

(30) Foreign Application Priority Data

Aug. 24, 2010 (JP) ................................ 2010-186782

(51) Int. Cl.

| C10M 133/44 | (2006.01) |
|---|---|
| H01L 21/321 | (2006.01) |
| C10M 133/22 | (2006.01) |
| B23D 61/18 | (2006.01) |
| C09K 3/14 | (2006.01) |
| B28D 5/00 | (2006.01) |
| H01L 21/306 | (2006.01) |
| H01L 21/02 | (2006.01) |
| C10M 173/02 | (2006.01) |
| C10M 133/38 | (2006.01) |
| C10M 133/42 | (2006.01) |
| C10M 133/46 | (2006.01) |

(52) U.S. Cl.
CPC .......... *C10M 133/44* (2013.01); *B23D 61/185* (2013.01); *B28D 5/0076* (2013.01); *C09K 3/1409* (2013.01); *C10M 133/22* (2013.01); *C10M 133/38* (2013.01); *C10M 133/42* (2013.01); *C10M 133/46* (2013.01); *C10M 173/02* (2013.01); *H01L 21/02024* (2013.01); *H01L 21/30625* (2013.01); *H01L 21/3212* (2013.01); *C10M 2207/022* (2013.01); *C10M 2215/222* (2013.01); *C10M 2215/223* (2013.01); *C10M 2215/224* (2013.01); *C10N 2230/06* (2013.01); *C10N 2240/00* (2013.01)

(58) Field of Classification Search
None
See application file for complete search history.

(56) References Cited

U.S. PATENT DOCUMENTS

| 5,693,596 | A | 12/1997 | Kaburagi et al. | |
|---|---|---|---|---|
| 5,817,711 | A * | 10/1998 | Kambe et al. | ............... 524/501 |
| 6,565,422 | B1 | 5/2003 | Homma et al. | |
| 2003/0068888 | A1 | 4/2003 | Kodera et al. | |
| 2004/0255924 | A1 | 12/2004 | Kondo et al. | |
| 2005/0008532 | A1 | 1/2005 | Jenkins et al. | |
| 2005/0155595 | A1 | 7/2005 | Kondo et al. | |
| 2007/0090094 | A1 | 4/2007 | Thompson et al. | |
| 2007/0254485 | A1 * | 11/2007 | Mao et al. | ................... 438/692 |
| 2008/0261499 | A1 * | 10/2008 | Tani et al. | ..................... 451/528 |
| 2011/0104992 | A1 | 5/2011 | Haga et al. | |

FOREIGN PATENT DOCUMENTS

| CN | 101336642 A | 1/2009 | |
|---|---|---|---|
| JP | 8 57848 | 3/1996 | |
| JP | 2003 82334 | 3/2003 | |
| JP | 2003 326449 | 11/2003 | |
| JP | 2010-1489 A | 1/2010 | |
| JP | 2011 149019 | 8/2011 | |
| TW | 200948868 A1 | 12/2009 | |
| WO | 2009 128430 | 10/2009 | |
| WO | WO2010092151 | * 8/2010 | ............ B23D 61/18 |

OTHER PUBLICATIONS

International Search Report Issued Sep. 27, 2011 in PCT/JP11/68899 Filed Aug. 23, 2011.
PCT, International Preliminary Report on Patentability for PCT/JP2011/068899, issued on Mar. 19, 2013.
Extended European Search Report issued Feb. 26, 2016 in Patent Application No. 11819900.9.

* cited by examiner

*Primary Examiner* — Jiong-Ping Lu
(74) *Attorney, Agent, or Firm* — Oblon, McClelland, Maier & Neustadt, L.L.P.

(57) ABSTRACT

A silicon-wafer processing fluid used for processing a silicon wafer contains a friction modifier containing a nitrogen-containing compound, pH of the nitrogen-containing compound being in a range from 2 to 8 when a mass ratio with water (i.e. nitrogen-containing compound/water) is 1/99. The nitrogen-containing compound is preferably a heterocyclic compound. The silicon-wafer processing fluid restrains an abrasion of abrasive grains rigidly attached to a wire and generation of hydrogen.

11 Claims, No Drawings ered or the
decrease in the processing efficiency and slicing accuracy.
Further, the chips may be reacted with water to generate
hydrogen, so that the processing fluid may spill over a
processing fluid tank.

SILICON WAFER PROCESSING SOLUTION AND SILICON WAFER PROCESSING METHOD

CROSS REFERENCE TO RELATED APPLICATIONS

The present application is a divisional of U.S. patent application Ser. No. 13/816,938, filed on Feb. 14, 2013, which is a 35 U.S.C. §371 national stage patent application of international patent application PCT/JP11/068899, filed on Aug. 23, 2011, which claims priority to Japanese patent application JP 2010-186782, filed on Aug. 24, 2010.

TECHNICAL FIELD

The present invention relates to a silicon wafer processing fluid and silicon wafer processing method.

BACKGROUND ART

In order to produce silicon wafers, processes including slicing a silicon ingot and polishing the silicon wafers are performed. For instance, a silicon ingot is sliced while supplying processing fluid to a wire. A silicon ingot is sliced according to either a loose abrasive method in which the silicon ingot is sliced while dispersing abrasive grains in the processing fluid or a fixed grain method in which the silicon ingot is sliced with the abrasive grains being rigidly attached on a surface of a wire.

The processing fluid used for the loose abrasive method includes an aqueous processing fluid containing, for instance, a friction coefficient reducer, an auxiliary corrosion-resistance agent and the like. The friction-coefficient reducer contained in the processing fluid is an unsaturated fatty acid. The auxiliary corrosion-resistance agent is benzotriazole (see Patent Literature 1).

The processing fluid used for the fixed grain method includes an aqueous processing fluid containing, for instance, glycols, carboxylic acids, alcanolamines and the like (see Patent Literature 2).

CITATION LIST

Patent Literatures

Patent Literature 1 JP-A-8-57848
Patent Literature 2 JP-A-2003-82334

SUMMARY OF THE INVENTION

Problems to be Solved by the Invention

According to the loose abrasive method as disclosed in Patent Literature 1, a large margin is required when a thick wire is used, so that a large amount of chips are generated and the yield rate after slicing a silicon ingot is deteriorated. On the other hand, since the wire is worn after being used, there naturally is a limit for reducing a diameter of the wire. Accordingly, the loose abrasive method is not productive as required for use in manufacturing silicon wafers for solar cells and the like, of which production is expected to greatly increase in the future.

According to the fixed grain method as disclosed in Patent Literature 2, since abrasive grains are rigidly attached to a wire in advance, the diameter of the wire can be reduced and less amount of chips are produced. However, the abrasive grains are worn or fallen off in accordance with the use of the wire in the fixed grain method. Consequently, the yield rate is deteriorated due to the breakage of the wire or the decrease in the processing efficiency and slicing accuracy. Further, the chips may be reacted with water to generate hydrogen, so that the processing fluid may spill over a processing fluid tank.

An object of the invention is to provide a silicon wafer processing fluid and a silicon wafer processing method capable of restraining abrasion of abrasive grains and generation of hydrogen.

Means for Solving the Problems

In order to solve the above problems, the invention provides a silicon wafer processing fluid and silicon wafer processing method as follows.

(1) A silicon-wafer processing fluid according to an aspect of the invention containing: a friction modifier comprising a nitrogen-containing compound, in which a pH of the nitrogen-containing compound is in a range from 2 to 8 when a mass ratio with water represented by the nitrogen-containing compound/the water is 1/99.

(2) The silicon-wafer processing fluid according to the above aspect of the invention, in which the nitrogen-containing compound is a heterocyclic compound.

(3) The silicon-wafer processing fluid according to the above aspect of the invention, in which the heterocyclic compound is selected from the group consisting of benzotriazole, 3,4-dihydro-3-hydroxy-4-oxo-1,2,3-benzotriazine, indazole, benzimidazole and derivatives thereof.

(4) The silicon-wafer processing fluid according to the above aspect of the invention, in which a pH of the silicon-wafer processing fluid is in a range from 3 to 9.

(5) The silicon-wafer processing fluid according to the above aspect of the invention, in which a content of the nitrogen-containing compound is in a range from 0.05 mass % to 10 mass % based on a total amount of the processing fluid.

(6) The silicon-wafer processing fluid according to the above aspect of the invention, in which the silicon-wafer processing fluid contains water in a range from 50 mass % to 99.95 mass % based on a total amount of the processing fluid.

(7) The silicon-wafer processing fluid according to the above aspect of the invention, in which the silicon-wafer processing fluid is used for processing a silicon wafer with a wire on which abrasive grains are rigidly attached.

(8) A silicon-wafer processing method according to another aspect of the invention including: using a silicon-wafer processing fluid containing a friction modifier comprising a nitrogen-containing compound; and processing the silicon wafer with a wire on which abrasive grains are rigidly attached, in which a pH of the nitrogen-containing compound is in a range from 2 to 8 when a mass ratio with water represented by the nitrogen-containing compound/the water is 1/99.

According to the invention, a silicon wafer processing fluid and a silicon wafer processing method capable of restraining abrasion of abrasive grains and generation of hydrogen can be provided.

DESCRIPTION OF EMBODIMENT(S)

A silicon-wafer processing fluid of the invention (sometimes referred to as "processing fluid" hereinafter) is used for processing a silicon wafer with a wire. In the following description, the processing fluid of the invention is used for slicing a silicon ingot according to the fixed grain method. However, the processing fluid of the invention may be used in the loose abrasive method.

The processing fluid of the invention contains a friction modifier. The friction modifier contains a nitrogen-containing compound, pH of the nitrogen-containing compound being in a range from 2 to 8 when a mass ratio with water (i.e. nitrogen-containing compound/water) is 1/99.

When pH is less than 2, the wire, wire saw and silicon may be corroded. On the other hand, when pH exceeds 8, the friction coefficient in slicing the silicon ingot is increased (i.e. friction is increased). Thus, it is preferable that pH is in a range from 3 to 7, more preferably in a range from 4 to 6.

The nitrogen-containing compound having pH of the above specific range is, for instance, a heterocyclic compound, which specifically is benzotriazole, 3,4-dihydro-3-hydroxy-4-oxo-1,2,3-benzotriazine, indazole, benzimidazole and derivatives thereof. Among the above, benzotriazole and 3,4-dihydro-3-hydroxy-4-oxo-1,2,3-benzotriazine are preferably used.

With the use of nitrogen-containing compound of the invention, the lubricity of the wire is enhanced, so that abrasion of the abrasive grains rigidly attached on the wire can be restrained and the abrasive grains can be kept from being fallen off from the wire. Accordingly, breakage of the wire can be prevented and the processing efficiency and slicing accuracy can be enhanced, thereby improving the yield rate. Further, the nitrogen-containing compound restrains the generation of hydrogen due to the reaction between the chips of a silicon ingot and water. As a result, the processing fluid is kept from spilling over the processing fluid tank.

Further, it is preferable that pH of the processing fluid of the invention is in a range from 3 to 9, more preferably in a range from 5 to 7. Since the pH of the processing fluid is in a range from medium acidity to mild alkalinity, the generation of hydrogen can be further restrained. In addition, the corrosion of wire and silicon can be prevented.

It is preferable that the content of the nitrogen-containing compound in the invention is in a range from 0.05 to 10 mass % based on a total amount of the processing fluid, more preferably in a range from 0.1 to 5 mass %. Since the content is at least 0.05 mass %, the abrasion of abrasive grains and generation of hydrogen can be further restrained and corrosion of wire and silicon can be prevented. On the other hand, since the content is at most 10 mass %, the production cost can be restrained.

The processing fluid of the invention contains water. The water may be of any kind of water including tap water and purified water. The content of water is preferably in a range from 50 to 99.95 mass %, more preferably in a range from 60 to 95 mass %. When the content of water is at least 50 mass %, environmental burden can be reduced as compared to ethyleneglycol that is conventionally used as a main component. Further, since water is the main component, inflammability can be lowered.

Next, the silicon-wafer processing method of the invention will be described below.

The silicon-wafer processing method of the invention is, for instance, a fixed grain method, where abrasive grains are rigidly attached on a wire in advance.

In performing the silicon-wafer processing method of the invention, a silicon ingot is introduced into a processing chamber of a wire saw in which the wire is stretched around.

Then, the silicon ingot is sliced while supplying the processing fluid of the invention to the wire.

Since the processing fluid of the invention contains the nitrogen-containing compound having pH of a specific range, abrasion of the abrasive grains can be prevented. Further, though the chips of the silicon ingot are generated, the nitrogen-containing compound of the invention restrains the reaction between the chips and water.

It should be noted that the processing fluid of the invention may be added with known additive(s) including friction modifier, antifoaming agent, metal deactivator, bactericide (preservative), viscosity modifier, pH modifier, thickener, dispersant and the like, as long as the addition of the additive(s) is not inconsistent with an object of the invention.

The friction modifier is used for restraining the abrasion of the abrasive grains. Various surfactants and water-soluble polymer compounds are usable as the friction modifier. Examples of the surfactant include non-ionic surfactant such as glycols. Examples of the water-soluble polymer compound include carboxylic acid polymer compounds such as polyacrylic acid and alkyleneglycol polymer compounds such as polyethylene glycol.

The antifoaming agent is used for keeping the processing fluid from spilling out of the processing fluid tank provided inside the processing chamber. Examples of the antifoaming agent include silicone oil, fluorosilicone oil and fluoroalkylether.

Examples of the metal deactivator include imidazoline, pyrimidine derivative, thiadiazole and benzotriazole.

The bactericide (preservative) is used for preventing corrosion of the wire and the like. Examples of the bactericide (preservative) include paraoxy benzoic acid esters (parabens), benzoic acid, salicylic acid, sorbic acid, dehydroacetic acid, p-toluenesulfonic acids and salts thereof, and phenoxyethanol.

The pH modifier is used for adjusting the pH of the processing fluid of the invention in a range from 3 to 9. The pH modifier is classified into an acidic modifier and a basic modifier. Examples of the acidic modifier include acidic compounds such as polyacrylic acid and isononanoic acid. Examples of the basic modifier include basic compounds such as N-methyldiethanolamine and cyclohexyl diethanolamine.

The thickener is used for increasing the viscosity of the processing fluid of the invention to improve adherability to the wire. Thus, the abrasion of the abrasive grains can be restrained. Examples of the thickener include carboxylic acid polymer compounds and alkyleneglycol polymer compounds similar to the friction modifier.

The dispersant is used for restraining the chips from depositing on the wire saw. Examples of the dispersant include various surfactants and water-soluble polymers similar to the friction modifier.

The content of the additives may be determined in accordance with the intended use of the processing fluid. However, the total content of the additives is usually in a range approximately from 0.01 mass % to 30 mass % based on the total amount of the processing fluid.

Though the processing fluid of the invention is used for slicing a silicon ingot in the above description, the processing fluid of the invention may be used for polishing a silicon wafer.

Further, the manufacturing method of the processing fluid of the invention is not specifically limited. For instance, in terms of convenience in transportation and sales, the processing fluid may be prepared in a condensed state in which less amount of water is contained, and water may be added before use to adjust the concentration.

Though the main component of the processing fluid of the invention is water in the above description, glycols may alternatively be used as the main component.

EXAMPLES

Next, the invention will be described below in detail with reference to Examples. It should be noted, however, that the scope of the invention is by no means limited by the Examples.

Examples 1 to 3 and Comparatives 1 to 5

A processing fluid of a composition shown in Table 1 was prepared and was subjected to various tests for evaluation. The components contained in the processing fluid and the test items are shown below. Evaluation results and pH of the processing fluid are also shown in Table 1.

Components of Processing Fluid
(1) Water: tap water
(2) Propylene glycol
(3) Nitrogen-containing compound: benzotriazole (SEETEC BT manufactured by SHIPRO KASEI KAISHA, LTD)
(4) Nitrogen-containing compound: 3,4-dihydro-3-hydroxy-4-oxo-1,2,3-benzotriazine
(5) Nitrogen-containing compound: imidazole
(6) nitrogen-containing compound: 3,4-dihydro-2H-pyrido(1,2-a)pyrimidin-2-one.
(7) Nitrogen-containing compound: N-methyl diethanolamine (aminoalcohol MDA manufactured by Nippon Nyukazai Co, Ltd.)
(8) Dodecanedioic acid (registered trademark "Corfree M1", manufactured by INVISTA (Japan) K.K)

Test Items
(1) Reciprocatory Friction Test
1. Evaluation Method
The friction coefficient was measured for evaluation under the following test conditions.
2 Test Conditions
Tester: F-2100 manufactured by ORIENTEC Co., Ltd
Ball: 3/16 inch ball made of SUJ2
Test plate: polycrystalline silicon
Slide speed: 20 mm/s
Slide distance: 2 cm
Load: 200 g
(2) Hydrogen Generation Test
1. Evaluation Method
While supplying 1600 g of the processing fluid to a Ni-plated diamond wire (standard diameter 0.12 mm, grain size in a range from 12 μm to 25 μm), a polycrystalline silicon (□156 mm) was sliced under the following conditions. The processing fluid was cyclically used and the slicing operation was conducted for four times. Thus, a processing fluid containing activated silicon chips was prepared. The processing fluid containing the chips was left still. Generated gas was collected over water in a measuring cylinder and the quantity of the gas was determined according to the following test conditions. It should be noted that Comparatives 1 and 2 were not subjected to the test because they exhibited large friction coefficients.
2 Slicing Conditions
Wire saw: CS810 (single wire saw) manufactured by Diamond Wire Technology, LLC
Used amount of wire: 30 m (repeatedly used by reciprocatory movement)
Wire running speed: average 340 m/min
Target bow setting: 5°
3 Test Conditions
Test time: three days
Amount of processing fluid left still: 100 g
Content of measuring cylinder: 200 ml
(3) Resource-Saving Test
1. Evaluation Method
The processing fluid was evaluated according to the content of water contained in the processing fluid based on the following evaluation criteria.
2. Evaluation Criteria
Water content of at least 80%: A
Water content from 70% or more to less than 80%: B
Water content from 60% or more to less than 70%: C
Water content of less than 60%: D

TABLE 1

| | Component | pH | Ex.1 | Ex.2 | Ex.3 | Comp. 1 | Comp. 2 | Comp. 3 | Comp. 4 | Comp. 5 |
|---|---|---|---|---|---|---|---|---|---|---|
| Content (mass %) | Water | — | 99 | 99.5 | 99.5 | 99 | 99 | 95.8 | 15 | 100 |
| | Propylene glycol | — | — | — | — | — | — | — | 85 | — |
| | Benzotriazole | 5.2 | 1 | 0.5 | — | — | — | — | — | — |
| | 3,4-dihydro-3-hydroxy-4-oxo-1,2,3-benzotriazine | 3 | — | — | 0.5 | — | — | — | — | — |
| | Imidazole | 10.1 | — | — | — | 1 | — | — | — | — |
| | 3,4-dihydro-2H-pyrido(1,2-a)pyrimidin-2-one | 9.7 | — | — | — | — | 1 | — | — | — |
| | N-methyl diethanolamine | 10.8 | — | — | — | — | — | 2.5 | — | — |
| | Dodecanedioic acid | — | — | — | — | — | — | 1.7 | — | — |
| | Total | | 100 | 100 | 100 | 100 | 100 | 100 | 100 | 100 |
| | pH of processing fluid | | 6.6 | 7 | 3.5 | 10.2 | 9.8 | 8.5 | 6.9 | 7.8 |
| Results of evaluation | Reciprocatory friction test: friction coefficient | | 0.15 | 0.24 | 0.26 | 0.36 | 0.36 | 0.16 | 0.3 | 0.39 |
| | Hydrogen generation test: amount of hydrogen generated (ml) | | 8 | 15 | 16 | — | — | 200< | 66 | 200< |
| | Resource-saving test | | A | A | A | A | A | A | D | A |

Evaluation Results

As is shown in the results of Examples 1 to 3 in Table 1, the processing fluid of the invention reduces the friction coefficient due to the presence of a predetermined nitrogen-containing compound. Thus, the processing fluid restrains the abrasion of the abrasive grains and keeps the abrasive grains from being fallen off. Further, the processing fluid of the invention reduces the amount of generated hydrogen, so that the processing fluid is kept from spilling out of a processing fluid tank. Further, since the main component of the processing fluid of the invention is water, the processing fluid imposes less environmental burden and exhibits excellent source-saving performance.

In contrast, since the Comparatives 1 to 5 do not contain the nitrogen-containing compound of a predetermined pH as a friction modifier as required by the invention, increase in both the friction coefficient and generated hydrogen cannot be restrained. Further, since the main component of the processing fluid of Comparative 4 is propylene glycol, the processing fluid imposes larger environmental burden and exhibits poor source-saving performance.

INDUSTRIAL APPLICABILITY

The silicon-wafer processing fluid and silicon-wafer processing method of the invention are suitably used for slicing a silicon ingot with a wire on which abrasive grains are rigidly attached.

The invention claimed is:

1. A silicon-wafer processing method comprising:
   slicing a silicon ingot with a wire on which abrasive grains are rigidly attached while supplying a silicon-wafer processing fluid comprising a nitrogen-containing compound to the wire,
   wherein a pH of the nitrogen-containing compound in water is from 2 to 8 when a mass ratio of the nitrogen-containing compound/water is 1/99.

2. The silicon-wafer processing method according to claim 1, wherein the nitrogen-containing compound is a heterocyclic compound.

3. The silicon-wafer processing method according to claim 2, wherein the heterocyclic compound is at least one selected from the group consisting of benzotriazole, 3,4-dihydro-3-hydroxy-4-oxo-1,2,3-benzotriazine, indazole, benzimidazole and derivatives thereof.

4. The silicon-wafer processing method according to claim 1, wherein a pH of the silicon-wafer processing fluid is from 3 to 9.

5. The silicon-wafer processing method according to claim 1, wherein a content of the nitrogen-containing compound in the processing fluid from 0.05 mass % to 10 mass % based on a total amount of the processing fluid.

6. The silicon-wafer processing method according to claim 1, wherein the silicon-wafer processing fluid comprises water from 50 mass % to 99.95 mass % based on a total amount of the processing fluid.

7. The silicon-wafer processing method according to claim 1, wherein the silicon-wafer processing fluid comprises water from 60 mass % to 99.95 mass % based on a total amount of the processing fluid.

8. The silicon-wafer processing method according to claim 1, wherein the nitrogen-containing compound is benzotriazole.

9. The silicon-wafer processing method according to claim 1, wherein the nitrogen-containing compound is 3,4-dihydro-3-hydroxy-4-oxo-1,2,3-benzotriazine.

10. The silicon-wafer processing method according to claim 1, wherein the nitrogen-containing compound is indazole.

11. The silicon-wafer processing method according to claim 1, wherein the nitrogen-containing compound is benzimidazole.

* * * * *